(12) United States Patent
Koppelaar

(10) Patent No.: US 6,732,324 B2
(45) Date of Patent: May 4, 2004

(54) RECEIVER WITH IMPROVED DECODER

(75) Inventor: Arie Geert Cornelis Koppelaar, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 529 days.

(21) Appl. No.: 09/738,645

(22) Filed: Dec. 15, 2000

(65) Prior Publication Data

US 2001/0044920 A1 Nov. 22, 2001

(30) Foreign Application Priority Data

Dec. 20, 1999 (EP) .............................................. 99204406

(51) Int. Cl.[7] ............................................. H03M 13/00
(52) U.S. Cl. ........................................................ 714/784
(58) Field of Search ................................. 714/784, 751, 714/788, 701, 756, 780; 375/346, 355, 358, 265, 341, 232, 350; 382/238

(56) References Cited

U.S. PATENT DOCUMENTS 4,683,572 A * 7/1987 Baggen et al. ............... 714/756
4,835,772 A * 5/1989 Peile et al. .................. 714/762

OTHER PUBLICATIONS

Li, K.L. et al. "Performances of turbo codes with fading compensation in multipath channels' Vehicular Technology Conference 1999 IEEE 49th;page(s): 2413–2417 vol. 3; Jul. 1999".*

* cited by examiner

Primary Examiner—Guy J. Lamarre
(74) Attorney, Agent, or Firm—Laurie E. Gathman

(57) ABSTRACT

A receiver for receiving digital signals comprises a front end (18) for receiving RF signals and converting them into an input signal for an de-interleaver 22 for obtaining a de-interleaved signal. The output of the de-interleaver is connected to a decoder (24) which can be a Reed-Solomon decoder. The decoder (24) is able to use erasure information which indicates possible positions of errors in the de-interleaved signal for increasing the number of errors the decoder (24) can correct. In order to improve the error correcting capabilities of the receiver, this receiver comprises error prediction means (26) which predict the position of errors in the next codewords due to error bursts from the errors found in the present codeword. Such a predicted error is handled as an erasure by the decoder (24). To prevent that more erasures are presented to the decoder (24) than it can handle, it is proposed according to the present invention to determine a probability measure for all predicted errors and to present only those errors to the decoder (24) having the largest probability.

15 Claims, 5 Drawing Sheets

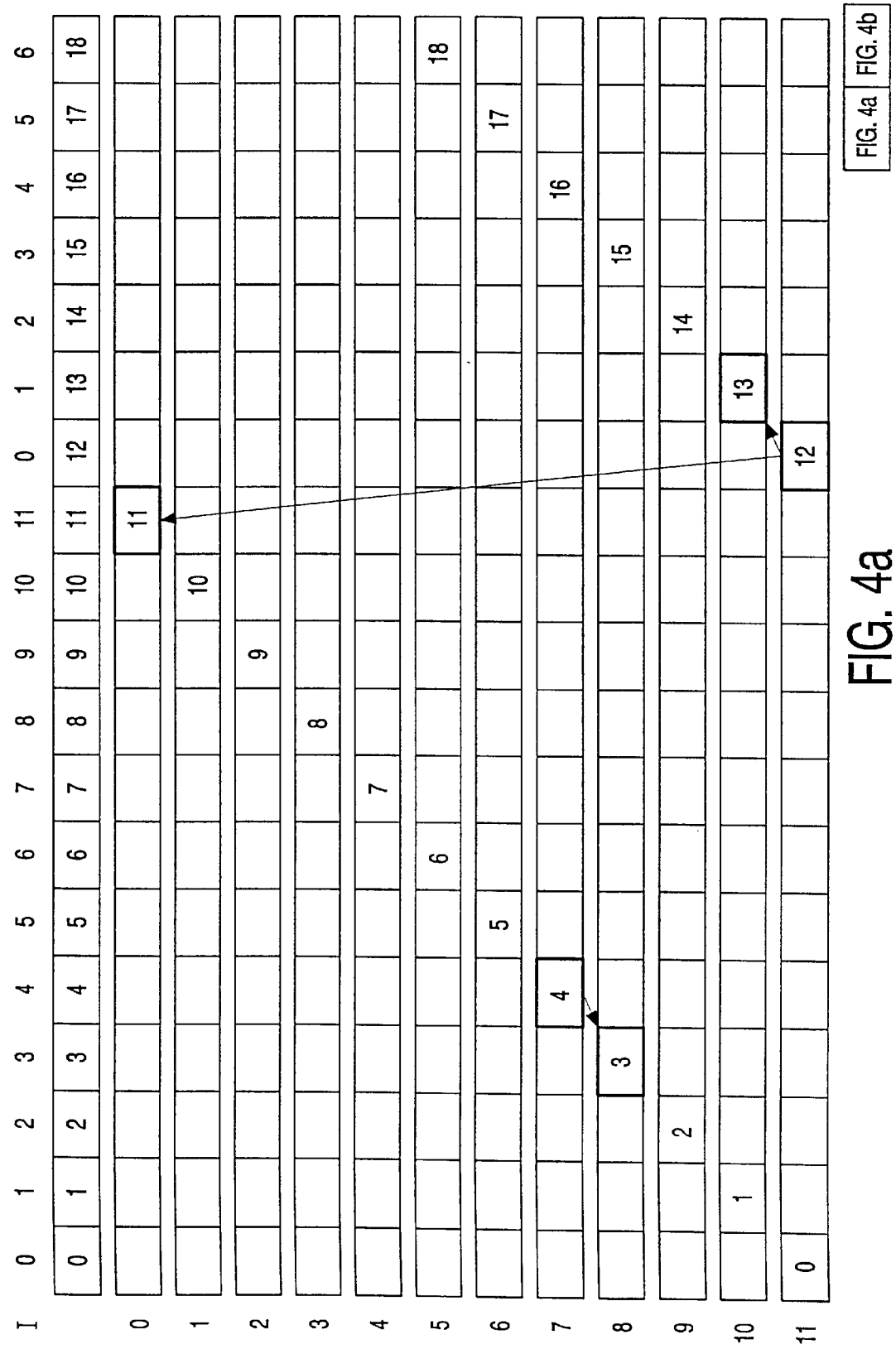

FIG. 4b

RECEIVER WITH IMPROVED DECODER

The present invention relates to a receiver for receiving encoded digital signals, said receiver comprises a front end for deriving words of digital symbols from an input signal, a de-interleaver for deriving de-interleaved words of digital symbols from said words of digital symbols, a decoder for deriving decoded words of digital symbols from said de-interleaved words of digital symbols and a burst error predictor for predicting possible symbol error positions in a de-interleaved word to be decoded from symbol error positions in at least one previously decoded de-interleaved word of digital symbols.

The present invention also relates to a decoder, a decoding method and a storage medium carrying a computer program for carrying out a decoding method.

A decoder according to the preamble is known from U.S. Pat. No. 5,299,208. Such receivers are used for receiving digital video signals or data signals from a transmission medium such as a satellite channel, a terrestrial channel or a CATV channel. In order to ensure a virtual error free transmission of the source symbols representing the video or data signals, channel coding is used. This channel coding often includes the use of a concatenated coding scheme. This concatenated coding scheme involves the encoding of the source symbols using an outer channel code, interleaving the encoded source symbols followed by encoding the interleaved symbols by an inner code. The outer code can be a block code such as a Reed-Solomon code, and the inner code is often a convolutional code.

The interleaving is used to decrease the vulnerability for burst errors, interleaving is used between outer coding and inner coding. The effect of interleaving is that burst errors are transformed into single error in multiple codewords. Because single errors are more easy to correct than burst errors, the use of interleaving will result in an increased performance on channels having bursty error characteristics.

The receiver for such a signal comprises a cascade connection of an inner decoder, a deinterleaver and an outer decoder.

In the above-mentioned U.S. patent the knowledge about the position of the single errors due to spread of burst errors is used to improve the quality of the decoder. Therefor this decoder comprises a burst error predictor that predicts the positions of possible errors from already occurred errors. This is possible by assuming that a burst error is present and using the known properties of the used interleaving scheme. The positions of all possible errors are passed to the outer decoder.

This outer decoder will regard the symbols at the indicated position as unreliable. E.g. in a Reed-Solomon decoder the indicated positions are treated as so-called erasures, errors of which the position is known. A Reed-Solomon decoder is able to correct n-1 random errors of which the position is not known, and 2n-1 errors (eraures) of which the position is known. This increase of error correcting capability results in an improved performance of the decoder.

A problem of the receiver according to the above-mentioned U.S. patent is that the numbers of unreliable symbols passed to the decoder can exceed its error correcting capabilities. In such a case, no decoding is possible at all. In the above U.S. patent, the structure of the interleaver is chosen such that the number of unreliable symbols is always limited to the error correcting capabilities of the decoder. This however imposes constraints on the type of interleaver that can be used.

The object of the present invention is to provide a receiver according to the preamble in which no constraints are imposed on the type of interleaver to be used.

To achieve said objective, the receiver according to the invention is characterized in that the receiver comprises a symbol error position selector for selecting from said possible symbol error positions a reduced number of possible symbol error positions and in that the symbol error position selector is arranged for providing the reduced number of symbol error positions to the decoder.

By reducing the number of possible error positions to be passed to the decoder, it is obtained that the error correcting capabilities of said decoder is not exceeded. This reducing is possible for each kind of interleaver to be used, resulting in that no constraints have to be imposed on the type of interleaver to be used.

An embodiment of the invention is characterized in that the symbol error position selector is arranged for selecting said reduced number of possible symbol error positions in dependence on a probability measure representing the probability that at a predicted error position the received symbol is actually wrong By passing only the symbol positions which are most likely to be wrong to the decoder, it is obtained that the most relevant positions are passed to the decoder and the less relevant are not. This results in an optimum decoding quality, given the numbers of predicted error positions which can be accepted by the decoder.

A further embodiment of the invention is characterized in that the burst error predictor is arranged for deriving the probability measure from errors present in previous words.

By deriving the probability measure from errors present in previous words, it is obtained that the probability measure is derived from actual statistical properties of the errors. This leads to a more accurate estimation of the probability measure, in particular when the statistical properties of the error measure change with time.

The present invention will now be explained with reference to the drawings

FIGS. 4a and 4b show a more detailed flowchart of the block 34 in FIG. 2.

Figure 1:
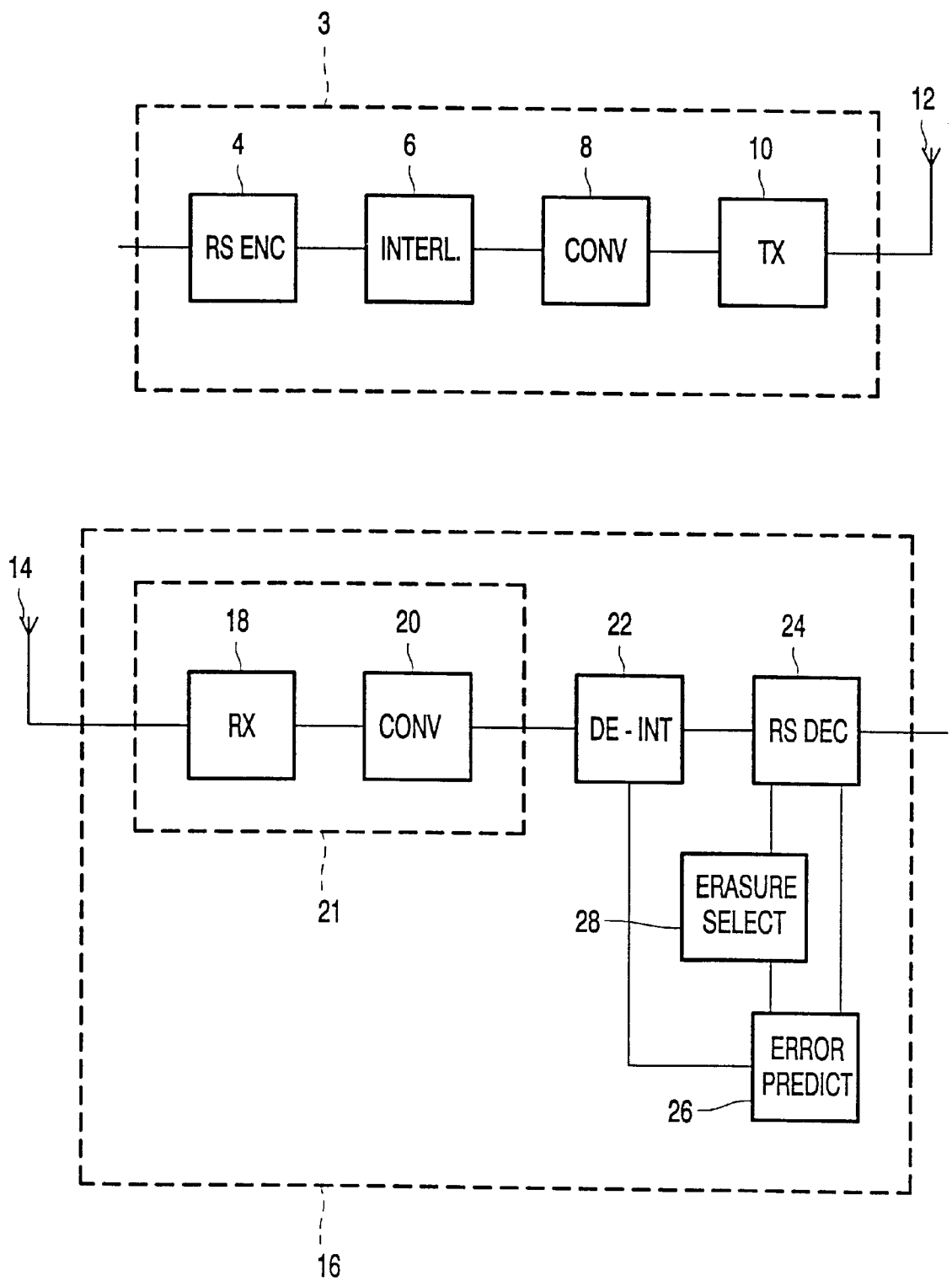
FIG. 1 shows a block diagram of a transmission system using a receiver according to the invention.

In the transmission system according to FIG. 1 symbols to be transmitted are applied to a block encoder which is here a Reed-Solomon encoder 4. The Reed-Solomon encoder encodes block of 188 input symbols by adding 20 parity bits. The output of the Reed-Solomon encoder 4 is connected to an input of an interleaver 6. The interleaver 6 can be e.g. a convolutional interleaver as will be explained later. The output of the interleaver 6 is connected to an input of a convolutional encoder 8 which encodes the interleaved symbols again. In DVB a punctured convolutional code with a basic rate of ½ is used, whose rate can be increased to rates ⅔, ¾, ⅘, ⅚ and ⅞ by puncturing.

The output of the convolutional encoder 8 is connected to an input of transmit means which modulate the output symbols of the convolutional encoder on a carrier and amplify the modulated signal to a level suitable for transmission. The output signal of the transmitter 10 is applied to an antenna 12.

An antenna 14 which is arranged for receiving the signal transmitted by the antenna 12 is connected to an input of a receiver 16. The input of the receiver 16 is connected to an input of receive means 18 which is arranged for amplifying and demodulating the signal received from the antenna 14.

The output signal of the receive means 18 is connected to an input of a convolutional decoder 20 which derives decoded symbols from its input signal. In the scope of the present invention, the combination of the receive means 18 and the convolutional decoder 18 constitute a front-end 21.

The output of the front-end 21 is connected to an input of a de-interleaver 22 which performs an operation which is inverse to the operation of the interleaver 6 in the transmitter 3. The output of the de-interleaver 22 is connected to an input of the decoder 24 for decoding the Reed-Solomon encoded code words. The decoder 24 provides at a first output the decoded codewords and at a second output the position of the symbols which are in error. The second output of the decoder 24 is connected to the burst error prediction means 26 which predict the positions of possible errors in the next codeword on basis of the positions of the errors in the present codeword, which positions are provided by the decoder 24. In order to do so, it is assumed that all the errors are part of a burst error. The position of the errors in the next codeword is predicted using the properties of the de-interleaver 22. To enable the error predictor 26 to know the state of the de-interleaver 22, a synchronization output of the de-interleaver is connected to a synchronization input of the error predictor 26.

The burst error predictor 26 provides all potential positions of errors together with a measure of their probability to the error position selector 28. The error position selector 28 selects a limited number of error positions to be passed to the Reed-Solomon decoder 24 as erasures in order not to exceed the error correcting capabilities of said Reed-Solomon decoder 24. Preferably, the error position selector 28 selects the N error positions having the largest probability. Reed-Solomon decoders which are able to accept "erasures" (error positions) are well known to those skilled in the art, and are e.g. discussed in the above mentioned U.S. Pat. No. 5,299, 208.

Figure 4B:
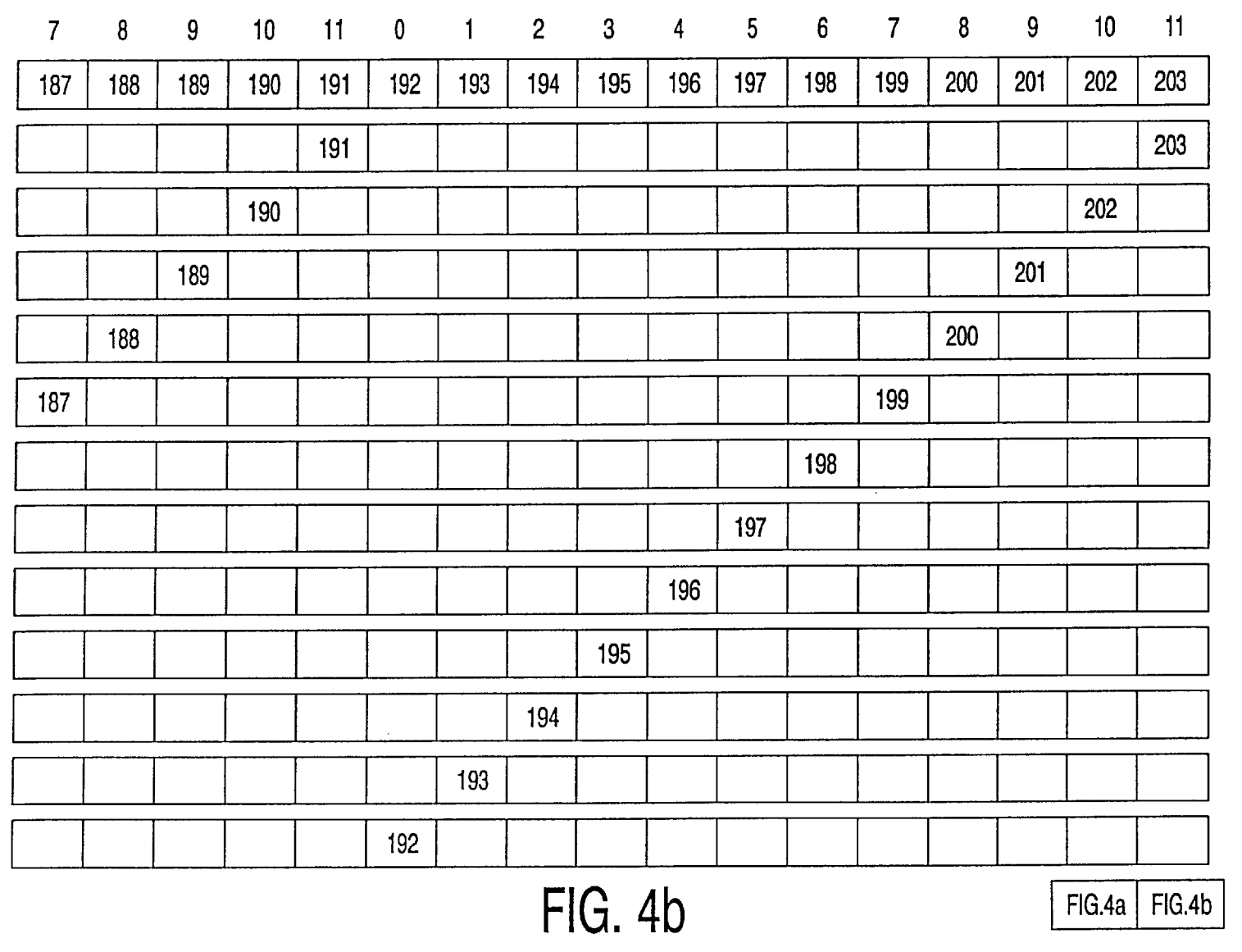

FIG. 4 shows the spreading of a burst error over subsequent codewords when an interleaver as specified in the DVB Satellite standard (EN 300 421). It can be derived that the distance between output bytes of the de-interleaver, presented adjacently at the input, is given by:

$$s(1) = \begin{cases} -N+1, & 0 \leq p \leq I-1 \\ 1 + N(I-1), & p = I-1 \end{cases} \quad (1)$$

In (1) N is the codeword length, I is the number of positions of the switching element in the de-interleaver as described in the DVB standard, p is the actual position of said switch and s(1) is the distance between two bytes at the output of the de-interleaver which were adjacent at the input of the de-interleaver 22. This is also shown in FIG. 4$a$ in which the subsequent Reed-Solomon codewords are displayed. The Reed-Solomon codewords, having a length of 204 bytes are numbered from 0 to 11. In FIG. 4$a$ an example of a long burst error at the input of the de-interleaver is shown. From this example is clear that for values of 1£p £11, if an error is found at a given position, the next error will be found in the next codeword but at one position earlier. E.g. if the byte indicated with 4 (RS word 7, position 4) is in error, the next error position to be predicted is the position of the byte indicated with 3 (RS word 8, position 3).

In Reed-Solomon word 11 an exception occurs. If a byte in RS codeword 12 is in error, no prediction of the next error is possible, because the adjacent input bytes 11 and 13 are found in (previous) RS words 0 and 10, making a prediction useless. Consequently possible error positions can be predicted according to:

$$\tilde{p}_i(\tau+1) = \begin{cases} p_i(\tau) - 1, & p_i(\tau) \bmod I \neq 0 \\ -\infty, & p_i(\tau) \bmod I = 0 \end{cases} \quad (2)$$

In (2) $\tilde{p}_i(\tau)$ is the predicted position of a potential error in the next codeword, is the number of the RS codeword, and I is a parameter of the combination of interleaver and de-interleaver, e.g. 12 for the DVB satellite standard. The value of ∞ indicates that actually no prediction is made.

It is possible to improve the error prediction for error in RS codeword 0, because the adjacent input bytes end up in later RS codewords. An example is byte 11 in RS word 0. If in this bytes an error occurs, the predicted next error positions are byte 10 in RS codeword 1 and byte 12 in RS codeword 11. This situation is presented in the following table:

| $P_i$ mod I (codeword τ) | Prediction of potential error position (Codeword number, position) |
| --- | --- |
| 0 | $-\infty$ |
| 1, . . . ,I-2 | (τ + 1, $p_i$ − 1) |
| I-1, $p_i \neq$ N-1 | (τ + 1, $p_i$ − 1) (τ + I − 1, $p_i$ + 1) |
| I-1, $p_i =$ N-1 | (τ + 1, $p_i$ − 1) (τ + I,0) |

Figure 2:
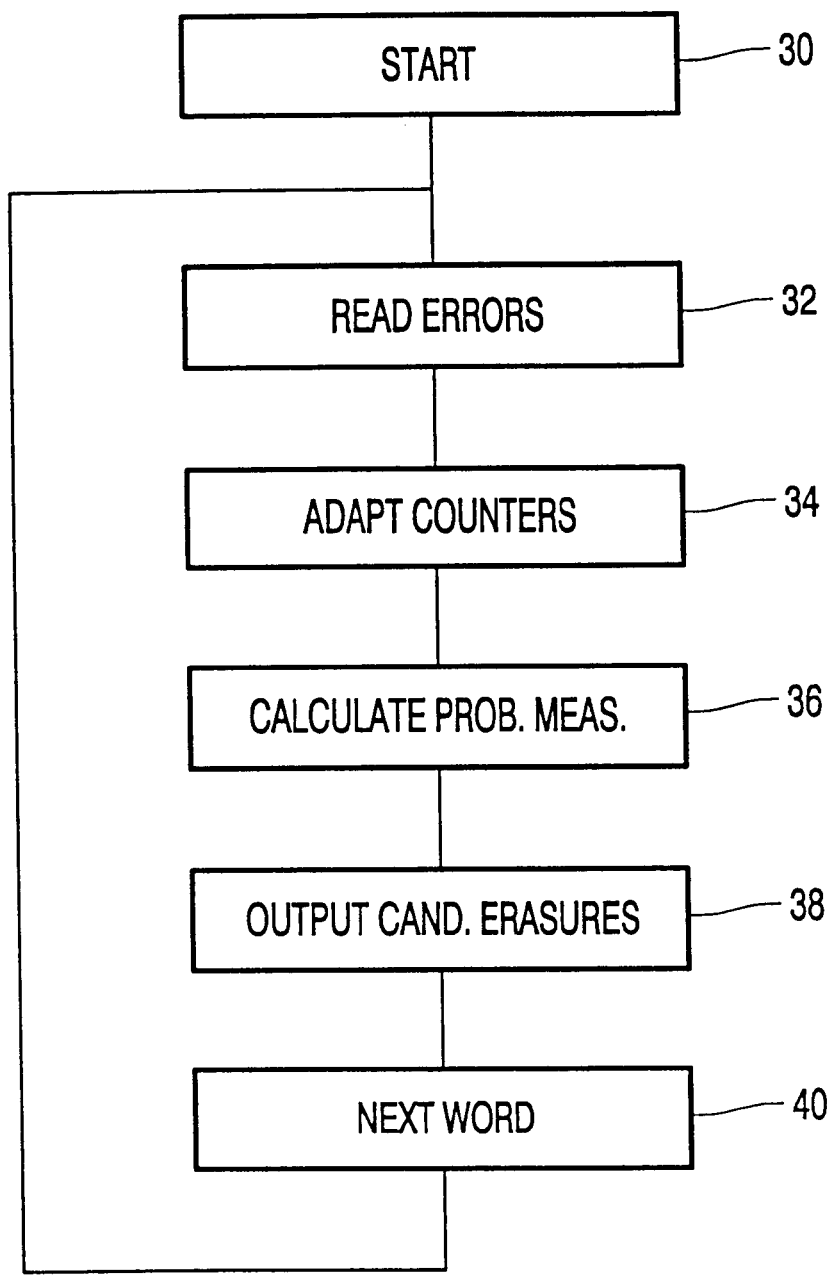
FIG. 2 shows the spreading of a burst error over the output words of the de-interleaver 22 in FIG. 1.

In the flowgraph according to FIG. 2, the numbered instructions have the following meaning.

| No. | Inscription | Meaning |
| --- | --- | --- |
| 30 | START | The program is started. |
| 32 | READ ERRORS | The error positions are read from the decoder 24 |
| 34 | ADAPT COUNTERS | The error counters are adapted |
| 36 | CALCULATE PROB. MEAS. | The probability of the new error positions are determined |
| 38 | OUTPUT CAND. ERASURES | The candidate error positions with their probabilities are output. |
| 40 | NEXT WORD | The program continues with the next codeword. |

In instruction 30 the program is started and the required variables are initialized. In instruction 32 the error positions are read from the decoder 24 and stored. In instruction 34 the counters arranged for counting the length of currently present burst errors are adapted using the error positions read in instruction 32. This instruction 32 is explained later with reference to FIG. 4.

In instruction 36 the probability that the predicted error positions actually comprise an error is calculated using the values of the counters adapted in instruction 34. If it is assumed that the burst errors are stored in an two dimensional array C[M,X] in which M is an index number of a burst error and X is a number representing the row number, the rows 1,2 and 3 comprise the following: In row 1 (X=1) the number N, being the current length of the burst error is stored. In row 2 (X=2) the probability measure is stored. In row 3, the position of the predicted error in the next codeword is stored. In row 4 (X=4), a flag F is stored of which the meaning will be explained later.

The probability that at the predicted error position the received symbols is indeed in error can be calculated according to:

$$P(\tilde{p}_k(\tau+1) \text{ has error}) = \frac{\sum_{M=1}^{Q}(C[M,1] > C[k,1])}{\sum_{M=1}^{Q}(C[M,1] \leq C[k,1])} \quad (3)$$

In (3) $\tilde{p}_k$ is the $k^{th}$ error position and Q is the total number of burst errors presently being counted. The summation in the numerator of (3) represents the number of counters having a larger count value than the current counter and the denominator of (3) represents the number of counters having a larger or equal count than the current counter.

In instruction 38 the candidate error positions together with their probability are passed to the selector 28. In instruction 40 the next word is chosen and the program is restarted at instruction 32.

Figure 3:
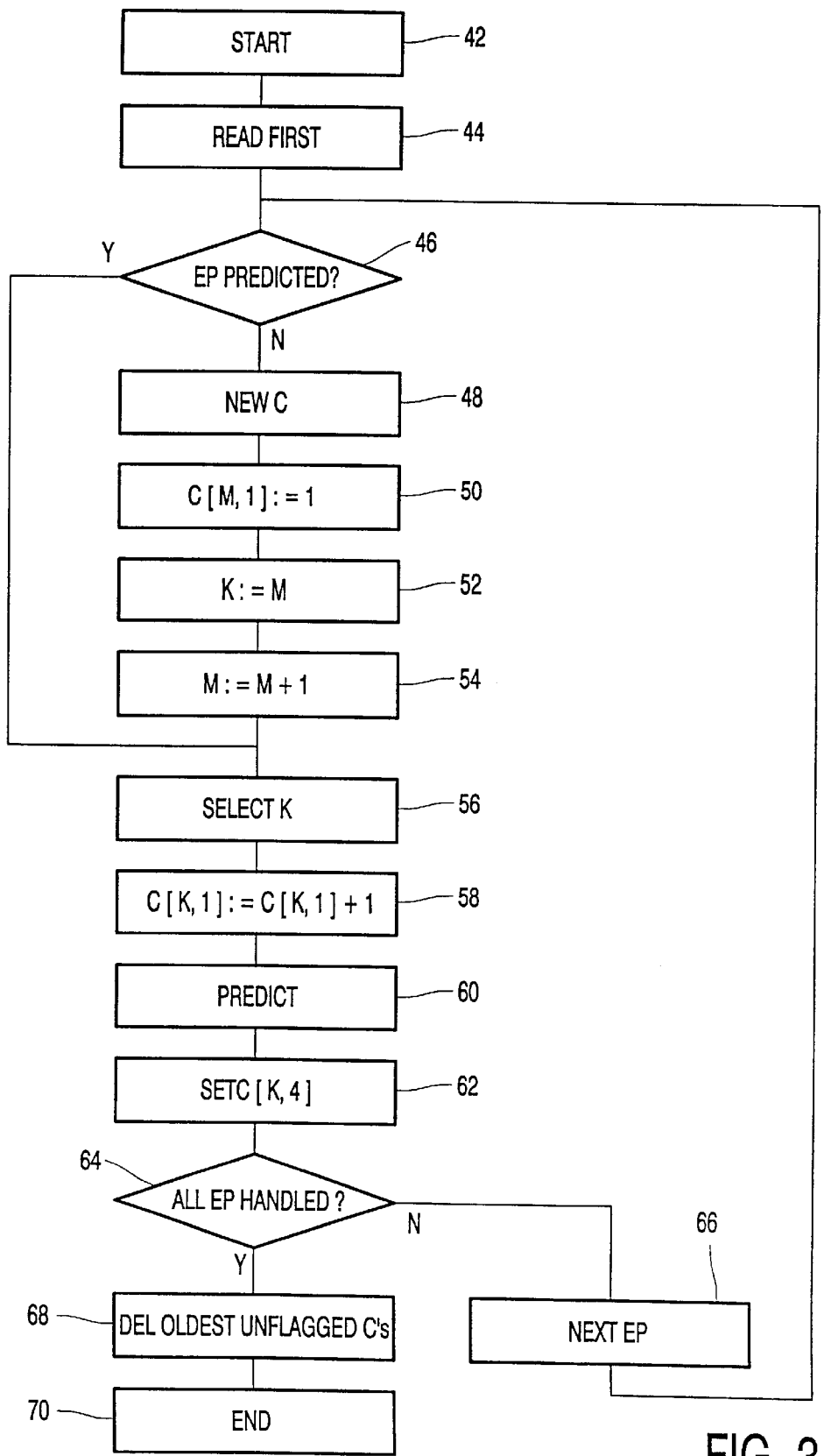
FIG. 3 shows a flowchart of a program for a programmable processor to implement the functions of the burst error predictor 26 in FIG. 1

In the flowgraph according to FIG. 3, the numbered instructions have the following meaning:

| No. | Inscription | Meaning |
| --- | --- | --- |
| 42 | START | The program is started |
| 44 | READ FIRST EP | The first error position is read |
| 46 | EP PREDICTED ? | It is checked whether the current error position was predicted |
| 48 | NEW C | A new counter C is created |
| 50 | C[M,1] := 1 | The new counter is set to 1 |
| 52 | K := M | The counter index K is set to M |
| 54 | M := M + 1 | The value of M is incremented to prepare for new counter |
| 56 | SELECT K | The index of the counter corresponding to the new error is selected |
| 58 | C[K,1] :=C[K,1] + 1 | The value of the selected counter is incremented |
| 60 | PREDICT P | The position of the next error corresponding to the current error is predicted |
| 62 | SET C[K,4] | The error present flag is set |
| 64 | ALL EP HANDLED ? | It is checked whether all error positions are checked. |
| 66 | NEXT EP | The next error position is taken |
| 68 | DEL UNFLAGGED C's | The counters of ended bursts are deleted |
| 70 | END | The program is terminated |

In instruction 42 of program for updating the counters (instruction 34 in FIG. 2) according to FIG. 3, the program is started. In instruction 44 the first error position of the current decoded word is read from the decoder 24 in FIG. 1. In instruction 46 it is checked whether the current error position was predicted from the previous error. This can be done by scanning all elements of the array C and comparing the value C[R,3], which holds a predicted error positions ($1 \leq R \leq M$), with the value representing the current position. M represents the present numbers of counters. If a correspondence between the value C[R,3] of one of the array elements and the position of the current error is found, this error was predicted. Otherwise the error was not predicted.

If the error was not predicted, it is assumed that a new error burst has started and the execution of the program is continued at instruction 48. In instruction 48 a new array element C, representing a new counter is created. In instruction 50 the value of the new counter is set to 1. In instruction 52 an index value K, identifying the current counter is made equal to M. In instruction 54 the value of M is incremented to prepare for the creation of a new counter in the next iteration of the loop. Subsequently the program is continued at instruction 58.

If in instruction 46 it was determined that the error was predicted, it is assumed that the present error burst continues, and the program is continued at instruction 56. In instruction 56 the index value K of the counter corresponding to the current error position is selected. This can be done by scanning the array elements until an array element is found for which C[K,3] is equal to the present error position. In instruction 58 the counter selected by the index K is incremented. Subsequently, the program continues at instruction 60.

In instruction 60 the potential error position in the next codeword is predicted and stored in C[K,3]. This prediction is performed as explained with reference to FIG. 2, in which only one new error position is predicted. Subsequently, in instruction 62 a flag, stored in C[K,4], is set to indicate that the element C[K,4] represents an error in an error burst.

In instruction 64 it is checked whether all error positions in the current word are handled. If this is not the case, in instruction 66 the next error position is selected and the program is continued with instruction 46.

If all error positions have been handled, the program is continued with instruction 68. In instruction 68 the oldest element of the array C that are not flagged are deleted to prevent an excessive growth of the number of counters held in memory. The not flagged elements can easily be found by reading the elements one by one and checking the value of the flag. It is observed that the set flags are reset in order to bring the elements in a correct state for the next codeword to be processed. In instruction 68 also the value of I is decreased with the number of counters deleted in instruction 68.

In instruction 70 the sub-program is terminated.

What is claimed is:

1. Receiver for receiving encoded digital signals comprising:

a front end for deriving words of digital symbols from an input signal;

a de-interleaver for deriving de-interleaved words of digital symbols from said words of digital symbols;

a decoder for deriving decoded words of digital symbols from said de-interleaved words of digital symbols;

a burst error predictor for predicting possible symbol error positions in a de-interleaved word to be decoded from symbol error positions in at least one previously decoded de-interleaved word of digital symbols; and a symbol error position selector for selecting from said possible symbol error positions a reduced number of possible symbol error positions, wherein the symbol error position selector is arranged for providing the reduced number of symbol error positions to the decoder.

2. Receiver according to claim 1, wherein the symbol error position selector is arranged for selecting said reduced number of possible symbol error positions in dependence on a probability measure representing the probability that at a predicted error position the received symbol is actually wrong.

3. Receiver according to claim 2, wherein the burst error predictor is arranged for deriving the probability measure from errors present in previous words.

4. Receiver according to claim 1, wherein the symbol error position selector is arranged for selecting said reduced number of possible symbol error positions in dependence on the error correcting capabilities of the decoder.

5. Receiver according to claim 1, wherein the decoder is a Reed-Solomon decoder.

6. Decoding arrangement for decoding digital symbols comprising:
   a decoder for deriving decoded words of digital symbols from said digital symbols;
   a burst error predictor for predicting possible symbol error positions in a word to be decoded from symbol error positions in at least one previously decoded word of digital symbols;
   a symbol error position selector for selecting from said possible symbol error positions a reduced number of possible symbol error positions,
   wherein the symbol error position selector is arranged for providing the reduced number of symbol error positions to the decoder.

7. Decoding arrangement according to claim 6, wherein the symbol error position selector is arranged for selecting said reduced number of possible symbol error positions in dependence on a probability measure representing the probability that at a predicted error position the received symbol is actually wrong.

8. Decoding arrangement according to claim 7, wherein the burst error predictor is arranged for deriving the probability measure from errors present in previous words.

9. Decoding arrangement according to claim 6, wherein the symbol error position selector is arranged for selecting said reduced number of possible symbol error positions in dependence on the error correcting capabilities of the decoder.

10. Decoding arrangement according to claim 6, wherein the decoder is a Reed-Solomon decoder.

11. Decoding method comprising:
    deriving decoded words of digital symbols from said digital symbols;
    predicting possible symbol error positions in a word to be decoded from symbol error positions in at least one previously decoded word of digital symbols;
    selecting from said possible symbol error positions a reduced number of possible symbol error positions; and
    providing the reduced number of symbol error positions to the decoder.

12. Decoding method according to claim 11, wherein said step of selecting comprises selecting said reduced number of possible symbol error positions in dependence on a probability measure representing the probability that at a predicted error position the received symbol is actually wrong.

13. Decoding method according to claim 12, wherein said step of selecting further comprises deriving the probability measure from errors present in previous words.

14. Decoding method according to claim 11, wherein said step of selecting comprises selecting said reduced number of possible symbol error positions in dependence on the error correcting capabilities of the decoder.

15. Decoding method according to claim 11, wherein said step of deriving comprises deriving said decoded words according to a Reed-Solomon code.

* * * * *